United States Patent
Fan et al.

(10) Patent No.: US 8,092,595 B1
(45) Date of Patent: Jan. 10, 2012

(54) SELF-ASSEMBLY OF WATER-SOLUBLE NANOCRYSTALS

(75) Inventors: Hongyou Fan, Albuquerque, NM (US); C. Jeffrey Brinker, Albuquerque, NM (US); Gabriel P. Lopez, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 973 days.

(21) Appl. No.: 12/038,037

(22) Filed: Feb. 27, 2008

Related U.S. Application Data

(63) Continuation-in-part of application No. 10/683,810, filed on Oct. 10, 2003, now abandoned.

(51) Int. Cl.
*C30B 7/04* (2006.01)
(52) U.S. Cl. .............. 117/70; 117/68; 117/69; 427/226; 427/294; 427/350; 427/372.2; 252/582
(58) Field of Classification Search .................. 252/582; 117/68–70; 427/226, 294, 350, 372.2
See application file for complete search history.

(56) References Cited

U.S. PATENT DOCUMENTS

| | | | |
|---|---|---|---|
| 6,264,741 B1 * | 7/2001 | Brinker et al. .................. 117/11 |
| 6,548,264 B1 * | 4/2003 | Tan et al. ..................... 435/7.21 |
| 6,815,064 B2 * | 11/2004 | Treadway et al. ............ 428/403 |
| 7,226,953 B1 * | 6/2007 | Petruska et al. ................ 516/98 |

\* cited by examiner

*Primary Examiner* — Mark Kopec
*Assistant Examiner* — Haidung Nguyen
(74) *Attorney, Agent, or Firm* — Elmer A. Klavetter; Kevin W. Bieg

(57) ABSTRACT

A method for forming an ordered array of nanocrystals where a hydrophobic precursor solution with a hydrophobic core material in an organic solvent is added to a solution of a surfactant in water, followed by removal of a least a portion of the organic solvent to form a micellar solution of nanocrystals. A precursor co-assembling material, generally water-soluble, that can co-assemble with individual micelles formed in the micellar solution of nanocrystals can be added to this micellar solution under specified reaction conditions (for example, pH conditions) to form an ordered-array mesophase material. For example, basic conditions are used to precipitate an ordered nanocrystal/silica array material in bulk form and acidic conditions are used to form an ordered nanocrystal/silica array material as a thin film.

18 Claims, 5 Drawing Sheets

SELF-ASSEMBLY OF WATER-SOLUBLE NANOCRYSTALS

This application is a continuation-in-part application of U.S. patent application Ser. No. 10/683,810, entitled "Self-Assembly of Water-Soluble Nanocrystals," filed on Oct. 10, 2003 now abandoned, and claims priority to and the benefit of the filing of said U.S. patent application.

This invention was made with Government support under Contract No. DE-AC04-94AL85000 awarded by the Department of Energy and Contract No. CTS-9624841 through the National Science Foundation. The Government has certain rights in the invention.

BACKGROUND OF THE INVENTION

The invention relates to a method for making water-soluble nanocrystals, and, more particularly, to a method for making ordered nanocrystal arrays and subsequent nanocrystal mesophases through self-assembly of water-soluble nanocrystal-micelles.

Nanometer-sized crystallites of metals, semiconductors, and oxides exhibit optical, electronic and chemical properties often different from those of the corresponding isolated molecules or macroscopic solids. The ability to adjust properties through control of size, shape, composition, crystallinity, and structure has led to a wide range of potential applications for nanocrystals (NCs) in areas like optics, electronics, catalysis, magnetic storage, and biological labeling. Furthermore NC assembly into two- and three dimensional arrays is of interest for development of synthetic solids with collective optical and electronic properties that can be further tuned by the nanocrystal spacing and arrangement. For example, using uniformly-sized CdSe nanocrystals passivated with a close-packed monolayer of organic coordinating ligands (trioctylphosphine oxide or alkane-amines or mixtures thereof), monodisperse lyophobic colloids self-assembled to create periodic, three-dimensional quantum dot superlattices. In another instance, ordered CdSe quantum dot films were prepared, demonstrating optical gain and stimulated emission. In two-dimensional (2-D) quantum dot monolayers formed in a Langmuir trough, quantum mechanical tunneling was reported to occur between adjacent silver nanocrystals at an interparticle spacing below 1.2-nm and a reversible insulator-to-metal transition below 0.5-nm. Even richer transport and collective phenomena are expected for three-dimensional (3-D) NC arrays.

Despite recent advances in the synthesis and characterization of nanocrystals and nanocrystalline arrays, there remain numerous challenges that limit their practical utilization. For example, synthesis procedures generally used for metallic and semiconducting nanocrystals employ organic passivating ligands, making the nanocrystals water insoluble. This is problematic for biological imaging and for incorporation of nanocrystals in hydrophilic sol-gel matrices like silica or titania needed for the fabrication of robust, functional lasers. Furthermore, while steric stabilization of nanocrystals with organic passivating layers suppresses strong, attractive particle-particle interactions, thereby facilitating self-assembly of nanocrystal arrays, it necessarily causes the arrays to be mechanically weak and often thermally and chemically unstable. This ultimately limits routine integration of NCs into devices.

Three different approaches have been used to prepare water-soluble semiconductor NCs using currently-available hydrophobic NCs: 1) ligand-exchange, 2) encapsulation into a water-soluble shell (for example, silica or phospholipids) and 3) arrested precipitation in water. The ligand exchange method involves the use of carboxylic acid or amine terminated thiols (for example, amino-ethanethiol and mercaptopropionic acid) to replace trioctylphosphine or alkaneamine ligands. This often results in aggregation of resulting water-soluble NCs and a lower photoluminescence (PL) quantum efficiency (QE) (QE, 10-30%) than original NCs. In the case of CdSe NCs, the emission has been observed to be completely quenched after transfer into water, if no shell of a wider band gap material is used. The encapsulation of the NCs into a water-soluble shell typically yields PL QEs of 20-30%. The method of forming hydrophilic silica shell for transferring NCs into water involves several steps and thus has the additional disadvantage of being rather complicated and time-consuming. Arrested precipitation in water in the presence of stabilizers (for example, thiols) is a faster and simpler method to synthesize water-soluble quantum dots (QDs) and has been applied to several semiconductors potentially relevant to biolabeling (for example, CdS, CdSe, CdTe).

Useful would be a direct synthesis method of water-soluble nanocrystalline micelles (NC-micelles) utilizing hydrophobic compounds and their further formation into robust, ordered three-dimensional nanocrystalline mesophases in bulk or thin film forms.

DETAILED DESCRIPTION OF THE INVENTION

Figure 1:
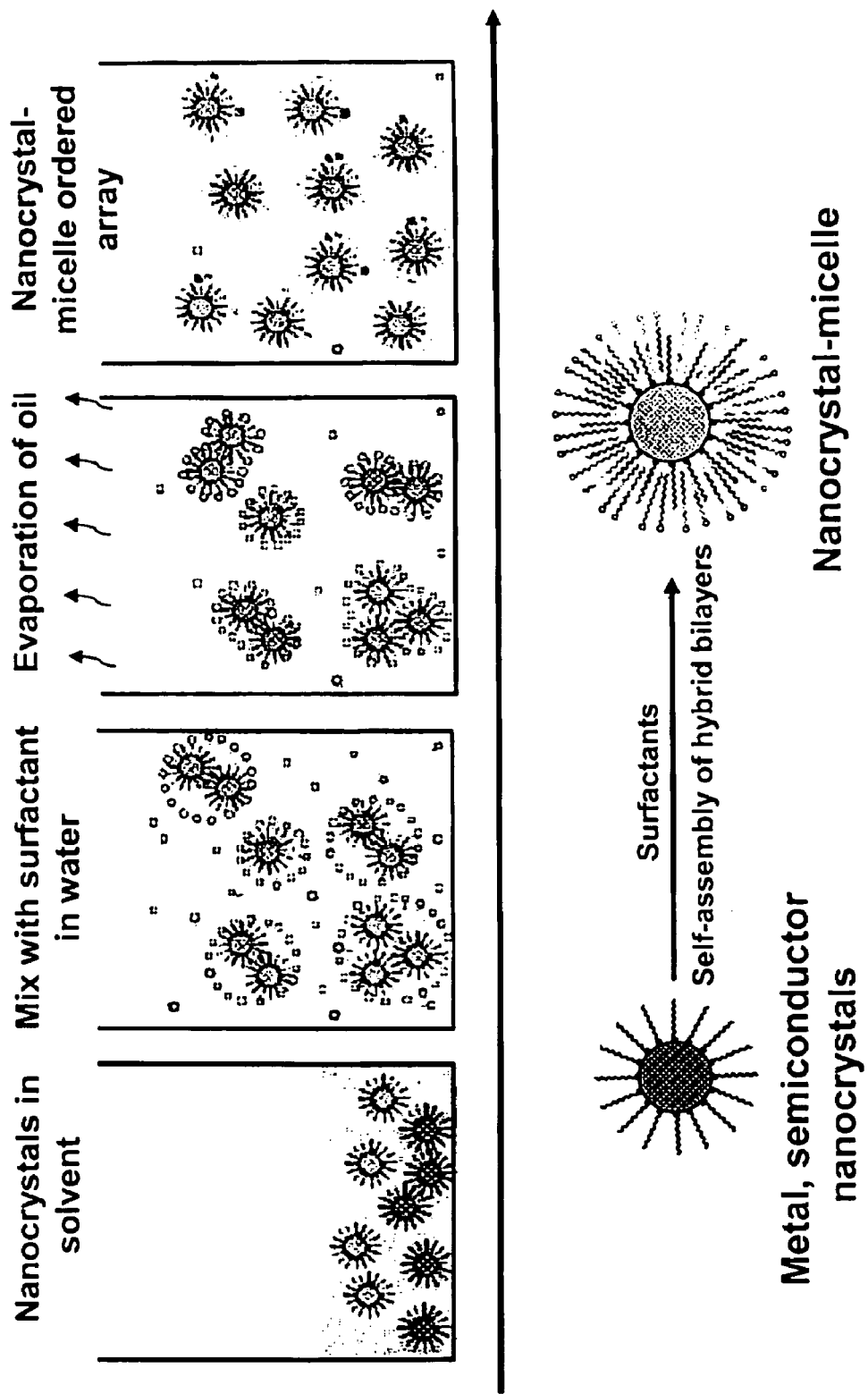
FIG. 1 illustrates the method for preparing a nanocrystal micellar solution.

In the method of the present invention, a hydrophobic precursor solution comprising a hydrophobic core material in an organic solvent is added to a solution of a surfactant in water, followed by removal of a least a portion of the organic solvent to form a micellar solution of nanocrystals (see FIG. 1). A precursor co-assembling material, generally water-soluble, that can co-assemble with individual micelles formed in the micellar solution of nanocrystals can be added to this micellar solution under specified reaction conditions (for example, pH conditions) to form an ordered-array mesophase material. For example, basic conditions are used to precipitate an ordered nanocrystal/silica array material in bulk form and acidic conditions are used to form an ordered nanocrystal/silica array material as a thin film.

The hydrophobic precursor solution can comprise any hydrophobic material in an organic solvent, wherein the hydrophobic material is the core material for the micellar solution formed and is a compound or material selected from, but not limited to, a metal, a semiconductor, a magnetic nanocrystal, a porphyrin, dye molecules, carbon nanotubes, fullerenes, including carbon 60 (C-60) compounds (that is a compound containing 60 carbon atoms), carbon 70 (C-70) compounds, carbon 80 (C-80) compounds, carbon 90 (C-90) compounds, and hydrophobic polymers. These hydrophobic materials include, gold, silver, II-VI and III-V nanocrystals, such as CdSe, CdTe, HgTe, CdHeTe, CdS, PdS, ZnS, ZnSe, CdSe/ZnS, InAs, InP, GaP, GaN, and ZnO among others, Ge, Co, Ni, Fe, Cu, Si, Pt, Pd, PtPd, FePt, and $BaTiO_3$, as well as oligomers, dendrimers, and polymers. It is required that these core materials be hydrophobic. The core material can be a single molecule, an oligomer, a polymer, a cluster, or a nanoparticle. They can exist as either a liquid or a solid. They can geometrically be a spherical particle, a rod or a tube. The organic solvent can be selected from any standard organic solvent, including both alkyl and aromatic compounds, that can adequately solubilize the hydrophobic material (for example, chloroform, hexane, and benzene). It is important to note that no hydrophilic compounds are added during the synthesis process, as addition of hydrophilic compound significantly changes both the composition and structure of the resulting materials. Additionally, this embodiment contemplates a method wherein only insignificant amounts of other components or the presence of other steps which do not materially affect the characteristics of the invention.

Surfactants such as a cationic surfactant, an anionic surfactant, a nonionic surfactant, a block polymer, or a lipid can be utilized as the surfactant in water. In particular, useful surfactants include compounds selected from the group consisting of sulfates, sulfonates, phosphates, carboxylic acids, alkylammonium salts, gemini surfactants, cetylethylpiperidinium salts, dialkyldimethylammonium, primary amines, poly(oxyethylene) oxides, octaethylene glycol monodecyl ether, octaethylene glycol monohexadecyl ether and block copolymers.

To form ordered nanocrystal mesophases, a precursor co-assembling material, such as a metal oxide, water-soluble oligomers and water-soluble polymers are mixed with the nanocrystal micellar solution in the presence of an acid or base. In one embodiment, the precursor co-assembling material, such as a metal oxide, as an alkoxysilane, such as tetraethylorthosilicate or tetramethylorthosilicate, or other metal oxides such as titanium butoxide, titanium iso-propoxide, zirconium n-butoxide, and aluminum iso-propoxide can be added to this micellar solution under basic conditions to precipitate an ordered, three-dimensional, mesophase nanocrystalline array in bulk form. To form a three-dimensional mesophase array as a thin film, the micellar solution of nanocrystals can be mixed with the precursor co-assembling material under acidic conditions to make a solution that can be formed as a thin film by deposition of the solution on a substrate by standard methods such as spin-coating or casting.

Figure 2:
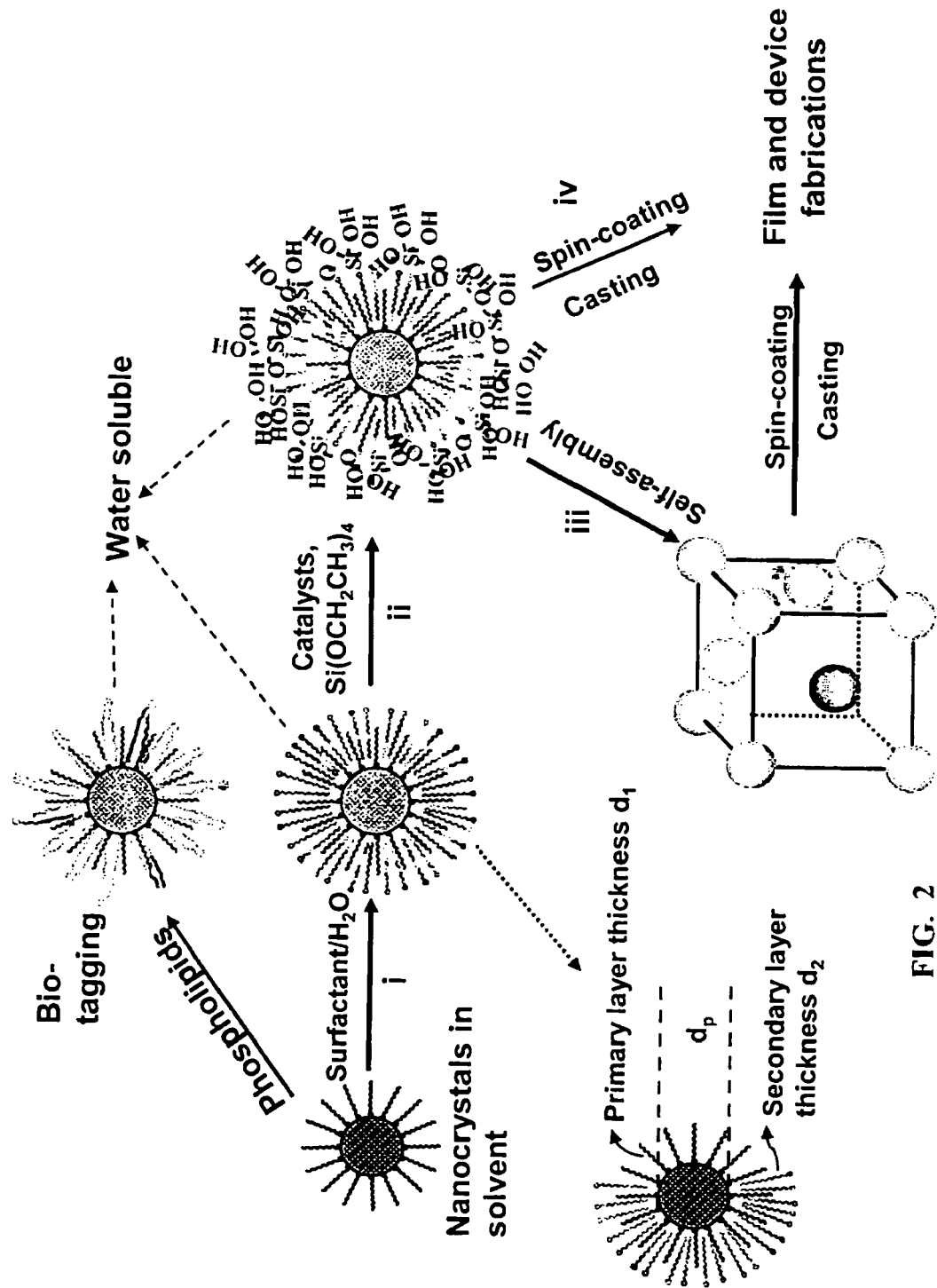
FIG. 2 illustrates the pathways for preparing a nanocrystal micellar solution, nanocrystal arrays, nanocrystal mesophase materials and subsequent processing.

In the present invention, monosized, organically-passivated nanocrystals are considered as large hydrophobic molecules that, if incorporated individually into the hydrophobic interiors of surfactant micelles, result in the formation of monosized nanocrystal (NC) micelles composed of a metallic (or other) NC core and a hybrid bilayer shell with precisely defined primary and secondary layer thicknesses (see FIG. 2, illustrating the primary layer thickness $d_1$ and secondary layer thickness $d_2$). The hydrophilic NC micelle surfaces would cause them to be water-soluble and allow further assembly or derivatization as further depicted in FIG. 2, which illustrates the method of the present invention of using nanocrystals in solution to form micellar solution and, through subsequent processing steps, forming nanocrystal mesophase materials. These hydrophilic NC micelle surfaces are formed during the method of the present invention; hydrophilic compounds are not added during the method of the invention.

The general preparation involves forming a first solution of a surfactant in water or alcohol or a mixture thereof. The surfactant is completely dissolved, such as by sonication or like method. A second solution is formed by dissolving the hydrophobic core material in an organic solvent. The first and second solutions can be formed in any order. Although heating of the solutions can be performed, the solutions can easily be formed at room temperature, These first and second solutions are mixed and the organic solvent is removed, such as by heat treatment or by vacuum, to form a third solution, where, upon evaporation of the solvent, yields a nanocrystal-micellar ordered array. In the nanocrystal-micellar ordered array, there are no empty micelles (that is, each micelle contains at least one hydrophobic core material compound). Under proper preparation conditions, each micelle can be prepared to contain one hydrophobic compound molecule. The third solution can also be deposited on a substrate, such as TEM grid, silicon, glass, mica, graphite and other standard substrates, wherein after evaporation of the solvent, yields ordered nanocrystal arrays.

To form thin film mesophases, an acid is added to the third solution with the addition of a precursor co-assembling material, such as a metal oxide, water-soluble oligomers and water-soluble polymers. In particular, metal oxides such as an alkoxysilane, such as tetraethylorthosilicate or tetramethylorthosilicate, or other metal oxides such as titanium butoxide, titanium iso-propoxide, zirconium n-butoxide, and aluminum iso-propoxide can be used. Water-soluble oligomers, including, but not limited to, water-soluble aniline and thiophene oligomers, and water-soluble polymers including, but not limited to, water-soluble polyaniline and polythiophene can also be used. The resulting solution can be deposited on a substrate by a standard method such as spin-coating, dip-coating or casting to form a thin film mesophase on the substrate. The acid used can be any standard acid in solution such as an aqueous HCl solution.

To form bulk mesophase material, the third solution is mixed with the precursor co-assembling material, such as a metal oxide, water-soluble oligomers and water-soluble polymers, in the presence of a base. In particular, metal oxides such as an alkoxysilane, such as tetraethylorthosilicate or tetramethylorthosilicate, or other metal oxides such as titanium butoxide, titanium iso-propoxide, zirconium n-butoxide, and aluminum iso-propoxide can be used. Water-soluble oligomers and water-soluble polymers can also be used. The resulting precipitated bulk mesophase material can be recovered by standard techniques, such as filtration, washing, and drying. The base can be any standard base in solution such as an aqueous NaOH or $NH_3$ solution.

To individually incorporate NCs in surfactant micelles, a micro-emulsion procedure was developed. A concentrated nanocrystal solution, prepared in organic solvent (such as chloroform or hexane), is added to an aqueous solution of surfactant with a volume ratio in one embodiment of 1:10 under vigorous stirring to create an oil-in-water micro-emulsion (higher and lower volume ratios can also achieve the micro-emulsion with the ratios dependent upon the particular reaction system considered). Organic solvent evaporation (aided optionally by vacuum or heat treatments) transfers the NCs into the aqueous phase by an interfacial process driven by the hydrophobic van der Waals interactions between the primary layer of the stabilizing ligand and the surfactant, resulting in thermodynamically defined interdigitated bilayer structures. In one embodiment, for single-tailed surfactants, an alkane chain of eight or more carbons is required to form micelles with gold nanocrystals stabilized by $C_{12}$ alkanethiols (dodecanethiol). Cationic, anionic, non-ionic surfactants, block polymers, or lipids can all form NC-micelles, allowing facile control of micelle surface charge and functionality.

Figure 3:
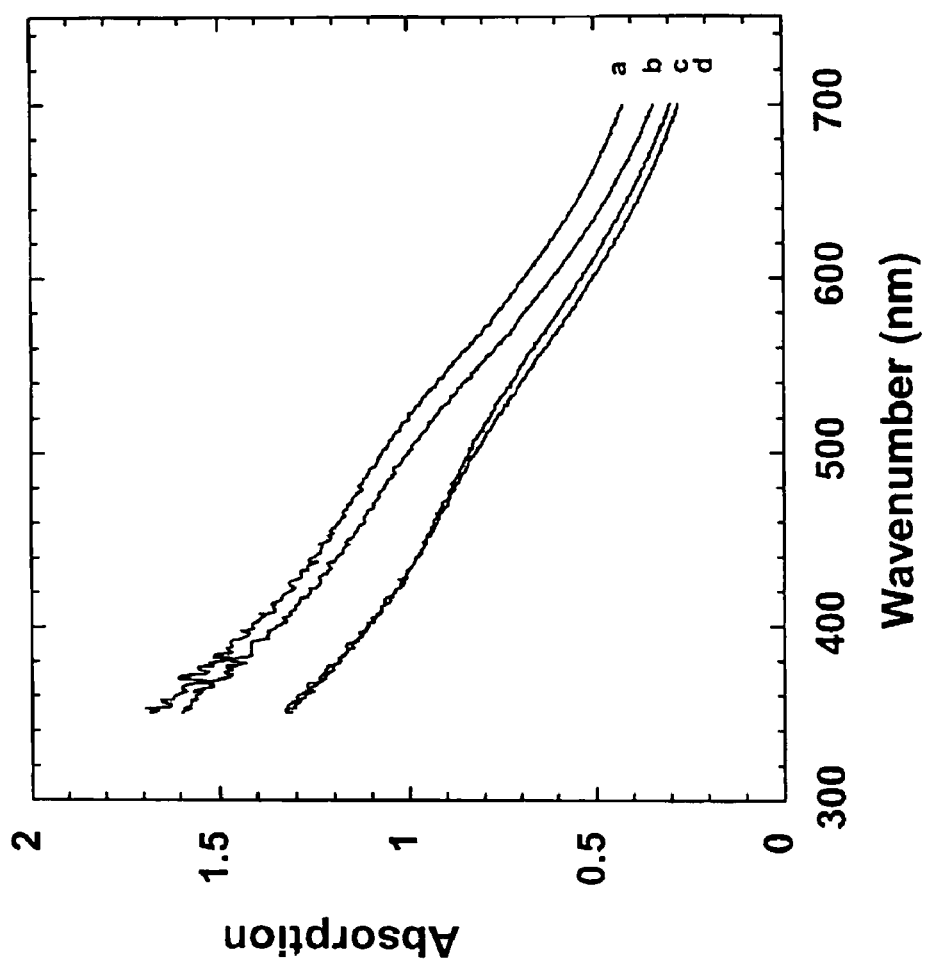
FIG. 3 shows the ultraviolet—visible spectra of gold nanocrystal micelles.

In one embodiment, fluorescent semiconducting CdSe NCs (stabilized by trioctylphosphine oxide) were formed into NC-micelles with maintenance of optical properties, further supporting the general nature and flexibility of this approach. NC-micelle solutions are generally colored and indefinitely stable (prepared solutions have been stable for greater than two years). In another embodiment, the formation of individual gold NC-micelles (as opposed to aggregated dimers, trimers and the like) was confirmed by ultraviolet (UV)/visible spectroscopy (FIG. 3), where no difference in the position or width of the plasmon resonance band (approximately 510-nm) of the $C_{12}$-alkanethiol stabilized gold NCs in chloroform and the resulting water soluble NC-micelles was observed. FIG. 3 shows the UV/visible spectroscopy results for gold NC-micelles using different classes of solvent: (a) anionic surfactant, $CH_3(CH_2)_{15}SO_3H$; (b) nonionic surfactant, $CH_3(CH_2)_{15}(CH_2CH_2)_8OH$; and (c) cationic surfactant, $CH_3(CH_2)_{15}N^+(CH_3)_3Br^-$; where curve (d) is n-dodecanethiol-derivatized gold in chloroform.

Figure 4:
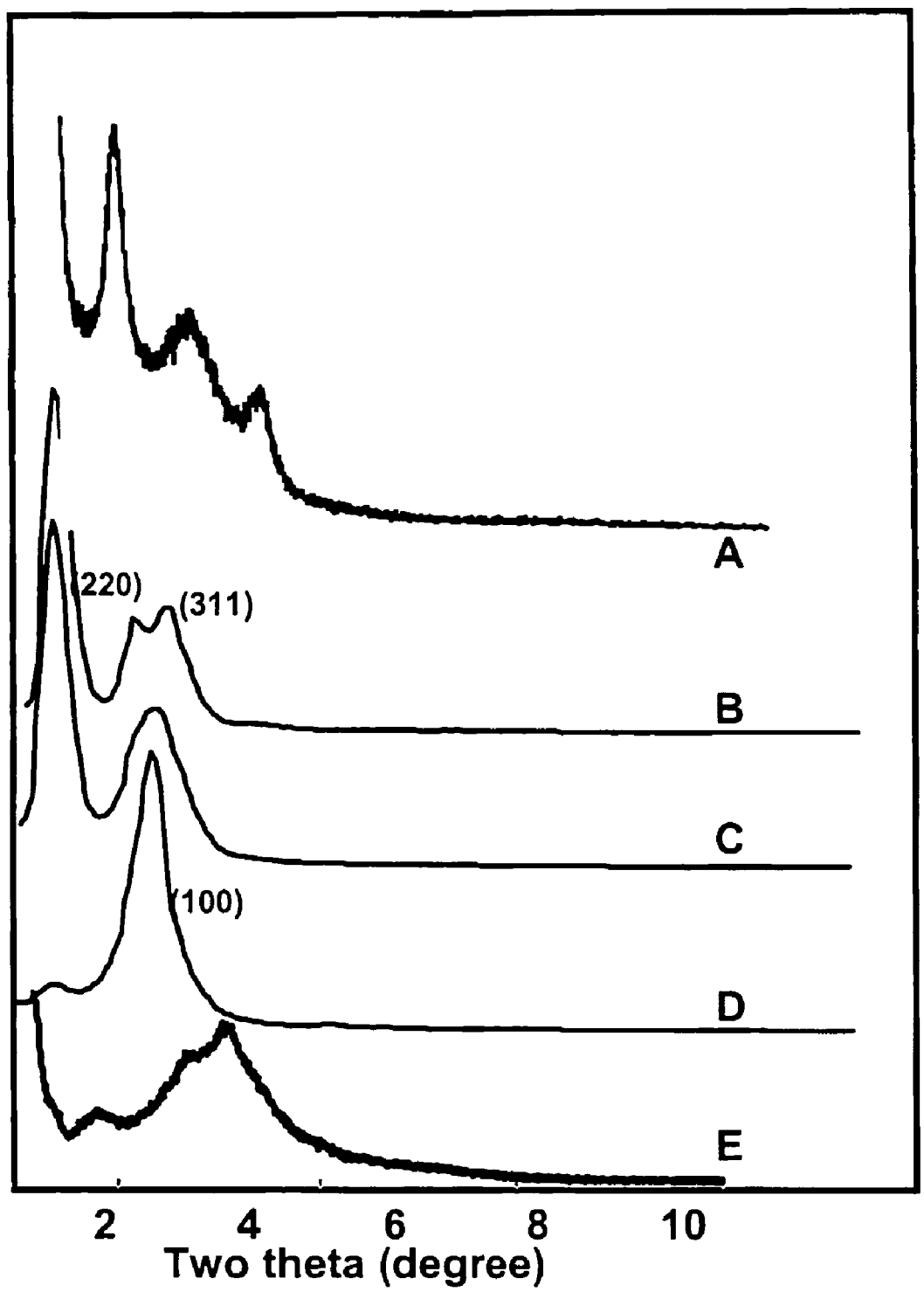
FIG. 4 shows low-angle x-ray diffraction patterns of materials prepared from the method of the present invention.

In addition, evaporation of the NC-micelles resulted in self-assembly of hexagonally ordered NC arrays as expected for individual, monosized nanocrystals. In aqueous media, NC-micelles organize hydrophilic components/precursors at the surfactant/water interface through electrostatic and hydrogen-bonding interactions in a mechanism analogous to that of surfactant-directed self-assembly of silica/surfactant mesophases (used as precursors to so-called mesoporous silicas). For example, addition of tetraethyl orthosilicate under basic conditions results in the formation of hydrophilic oligosilicic acid species that organize with NC-micelles to form a new type of ordered gold NC/silica mesophase with face-centered-cubic (FCC) symmetry (space group Fm3m). FIG. 4, curve A shows the x-ray diffraction (XRD) pattern of a gold NC/silica thin film mesophase material formed by spin coating according to the pathway i-ii-iv illustrated in FIG. 2. FIG. 4, curve B shows a representative low angle x-ray diffraction pattern of a nanocrystal mesophase powder prepared according to pathway i-ii-iii (illustrated in FIG. 2) using 2-nm diameter $C_{12}$-thiol stabilized gold NCs, cetyltrimethylammonium bromide ($C_{16}TAB$) surfactants, and sodium hydroxide catalyst. Based on FCC symmetry, the primary peaks are assigned as 111, 220, and 311 reflections. Prepared TEM images of [001]- and [012]-oriented nanocrystal mesophases are consistent with an FCC unit cell with a=(approximately) 10.2 nm and a uniform, minimum (silica/surfactant) spacing between NCs of approximately 6 nm. This appears to be the first example of an ordered FCC nanocrystal array formed spontaneously by self-assembly in aqueous media (rather than by solvent evaporation). Compared to other ordered NC arrays, the embedding silica matrix provides for greater chemical, mechanical, and thermal robustness and, compared to other connected NC systems (for example, those prepared by DNA hybridization), thermodynamically controlled self-assembly provides greater order and control of NC spacing.

It can be noted that reducing the concentration of the gold NCs, while maintaining a constant surfactant/silica molar ratio, caused the progressive transformation of the cubic, gold NC/silica mesophase to a 2-D hexagonal silica/surfactant mesophase (FIG. 4 XRD patterns represented by curves C and D, respectively). This is evident from the greatly diminished (111) reflection in XRD pattern D and the appearance of (100), (110), (200), and (210) reflections. This emphasizes that the highly ordered FCC gold NC/silica mesophase forms within a particular compositional range that is dependent upon the reaction system considered in which all the surfactant and gold is incorporated into NC micelles, allowing the host framework to be essentially pure, dense silica (polysilicic acid). Highly-ordered NC mesophases can also require very monosized nanocrystals as is demonstrated by the broad, poorly-defined XRD pattern (FIG. 4, curve E) obtained for a gold NC/silica powder sample prepared as in FIG. 4, curve B but using gold NCs synthesized according to another standard method that results in a rather broad size distribution (approximately 50° A compared to approximately 5% in the present invention).

As shown by additional XRD results, changing the primary NC particle size, $d_p$, the primary layer thickness, $d_1$, or the secondary layer thickness, $d_2$, allows adjustment of the NC mesophase lattice constant. For example, results have shown that the (111) d-spacing changes linearly from approximately 5.0 to 7.2-nm through variation of $d_p$ from 1.0 to 3.3-nm. Changing the secondary layer thickness $d_2$ by 4 carbon units ($CH_3(CH_2)_n(NCH_3)_3^+Br^+Br^-$, $n_L$=11 to $n_K$=15, where $n_L$ and $n_K$ are the carbon numbers in each surfactant) results in a 1.11-nm change in (111) d-spacing (1.38-Å/C-C bond) consistent with model predictions and structural studies.

Using acidic conditions designed to minimize the siloxane condensation rate (pH value of approximately 2), pathway i-ii-iv (FIG. 2) leads to the formation of thin films using standard techniques like dip-coating, spin-coating, or micromolding. By suppressing siloxane condensation and, thereby, gel formation, solvent evaporation accompanying coating induces self-assembly of NC-micelles into FCC nanocrystal thin film mesophases in a manner similar to the evaporation-induced self-assembly of cubic or hexagonal silica/surfactant thin film mesophases. The thin film XRD pattern (FIG. 4, curve A) is consistent with a slightly distorted FCC mesophase (face-centered tetragonal) due to constrained one-dimensional shrinkage normal to the substrate surface, observed consistently for thin film mesophases as a result of siloxane condensation. TEM images of films are qualitatively similar to those of powders, although both XRD and TEM indicate a reduced unit cell dimension (a=approximately 9.6 nm).

The ordered arrays of metallic nanocrystals (NCs) described herein are potential implementations of several types of model systems. Electrostatically, such an ordered array of metallic particles is identical to the composite model systems used in textbooks to describe the properties of polarizable media. They also may be a means of implementing nanocrystal memory devices wherein the nanocrystals are present in a single plane and serve to store charge and modify the channel conductance. However, the three-dimensional array of nanocrystals presented here offers a variety of opportunities to study the physics of transport. Thus the structures produced according to the method of the present invention could permit experiments and encourage modeling of new systems.

One advantage of the method of the present invention is its capability to utilize a wide variety of hydrophilic core materials and surfactants in the formation of the reactant solutions to subsequently form NC micelles. Through using surfactants/lipids with different functionally-terminated groups, these NC-micelles can be easily conjugated with a variety of biospecies such as Streptavidin, biotin, DNA, IgE, and antibodies, among others. The method can be finished in a single, rapid step of solvent evaporation without using special equipment. The results indicated that, in a laboratory environment, grams of water-soluble NCs can be prepared in less than 10 minutes. In other methods, such as the ligand exchanging method, chemical replacement reaction at nanocrystal interface occurs. This often results in the changes of nanocrystal physical properties such as band gap, aggregation, photoluminescence intensity and life time. In the method of the present invention method, the stabilization of hydrophobic nanocrystals in water relies on the thermodynamically favorable interdigitation of surfactants and nanocrystal stabilizing ligands formed after solvent evaporation. Without chemical replacement reaction involved, this does not affect the physical properties of original source hydrophobic nanocrystals. Additionally, the method can effectively prevent NC-micelles from aggregation and non-specific binding. Also, dense-packed surfactant/lipid layers help to prevent NCs from oxidation and preserve their luminescence properties.

As an initial investigation of charge transport in our ordered three-dimensional nanocrystal arrays, planar metal-oxide-semiconductor (MOS) devices (see schematic in FIG. 5) were fabricated with a gold NC/silica mesophase oxide prepared according to the method of the present invention, where the devices were prepared according to standard methods using the method of the present invention to put a film of gold NC/silica material on a substrate. Charge storage and decay was assessed by measuring the time and voltage behavior of the capacitance. Silicon (100) p-type wafers of approximately 1015 $cm^{-3}$ doping were cleaned using standard procedures, and backside contacts were deposited using approximately 420 nm of e-beam evaporated Al, followed by a 450° C. forming gas anneal for 25 minutes. Gold NC/silica films, approximately 90-nm thick, were deposited by spin-coating and annealed in UV at room temperature for 1.5 hours to remove organics and promote additional siloxane condensation. Capacitor structures were formed by e-beam evaporation of Al (approximately 300 nm) through a shadow mask. Control samples were fabricated by spin-coating gold-free silica sols designed to form silica layers comparable to the silica matrices of the NC/silica films and by using a conventional thermal silicon dioxide insulator. High frequency capacitance-voltage (C-V), current-voltage (I-V) and charge storage measurements were performed on all films at room temperature.

Figure 5:
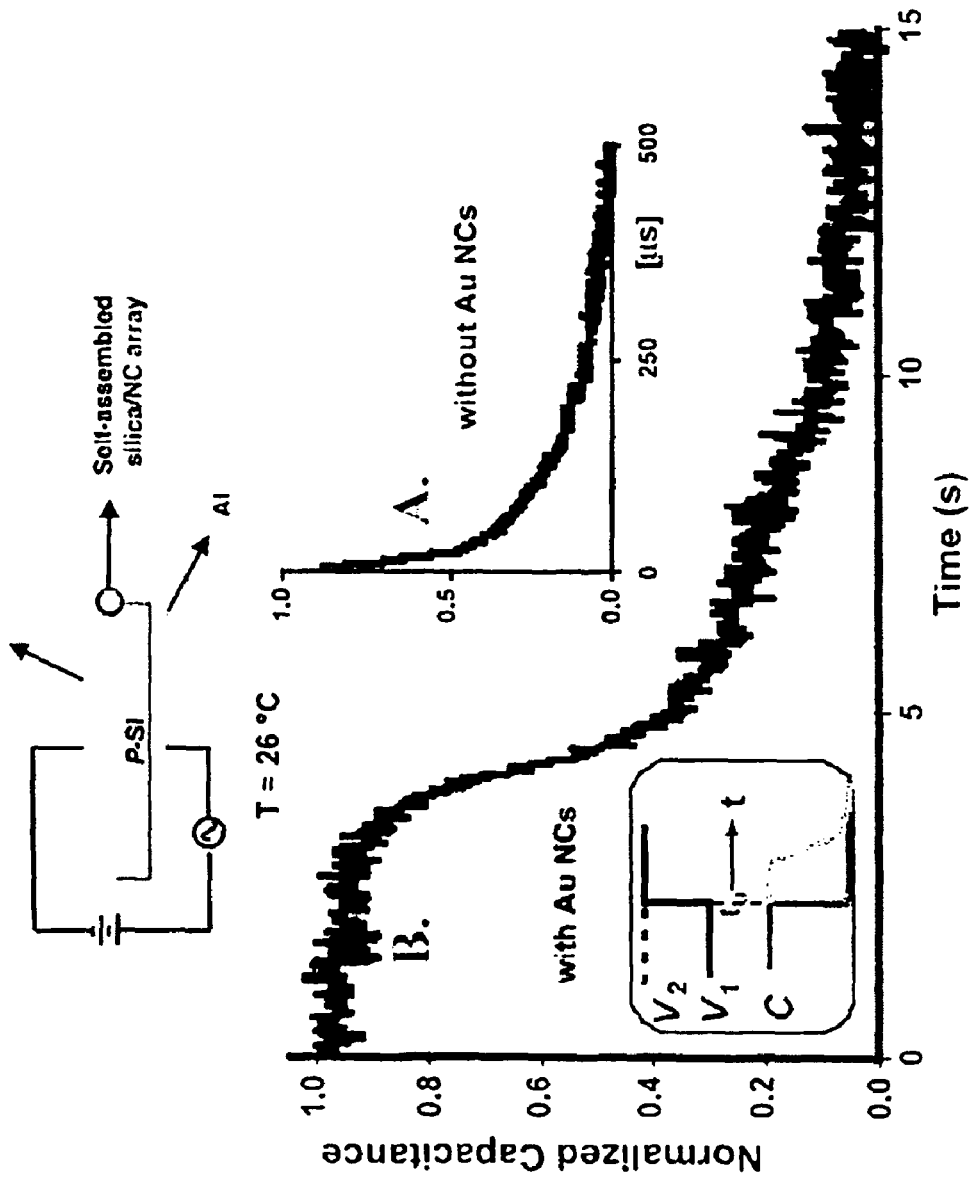
FIG. 5 illustrates a MOS device utilizing the material prepared from the method of the present invention and the subsequent results of electric field-aided transport measurements.

FIG. 5 presents results of electric field-aided transport measurements performed on both types of MOS devices. For this measurement, the sample was initially biased at V1 for 50 seconds, then rapidly switched (<1 ms) to V2 and the time evolution of the capacitor charge monitored. Samples without gold exhibited an exponential discharge (with a time constant of approximately 100 ms) consistent with normal RC discharge behavior. For samples with gold, an olive (S-shaped) profile with an approximately 7.5 second discharge time was observed. The total excess charge contained in this capacitor was approximately $2.8 \times 10^{-11}$ C. Assuming the capacity of each nanocrystal to be one electron based on electrostatic energy considerations, this corresponds to $10^{18}$ $cm^{-3}$ charged NCs. This was attributed to the charging of the gold in the oxide near the gate electrode when the gate is negatively biased. After reversing the gate voltage to V2, the electrons on the gold NCs were swept out of the oxide into the gate sequentially from the gate side first. No change in substrate capacitance occurred until the gold NCs in the oxide were discharged as they effectively pinned the Si-surface in accumulation. Using the FCC lattice constant, a uniform gold NC concentration in the oxide was estimated to be approximately $4 \times 10^{18}$ $cm^{-3}$. However, only those NCs located near the gate electrode could respond to the high frequency signal used to measure the capacitance, resulting in roughly all of the NCs in the first 25% of the oxide film being occupied by electrons. Given the spacing for these dots, coulomb blockade effects are expected to control transport amongst the gold NCs. However, disorder and trapping within the silica matrix could prevent collective effects, so transport in this situation is probably also influenced by a combination of local kinetic and diffusive factors, particularly at room temperature where these experiments were performed. Still, in that charge storage and transport behavior was observed, that was completely different from that of the corresponding MOS capacitor prepared sans gold with silica identical to the host matrix of the NC array, it is evident that charge is stored on the gold NCs and that the discharge characteristics are dominated by electron transport involving the nanocrystals.

With improvement, these NC arrays could be the ideal media for the study of the Hubbard Hamiltonian and the variety of transport and collective phenomena predicted to occur for such systems. Key to such studies is the ability to control the array lattice constant and hence the spacings between individual NCs as we demonstrate. Briefly summarizing the implications for transport studies, wider spacing between the NCs leads to weaker coupling and creates the situation for observing the collective coulombic blockade behavior described for a one-dimensional array. Stronger coupling arising in more closely spaced dots permits efficient tunneling between the dots and observation of such phenomena as quantum Hall behavior and intricate energy gap dependence on magnetic field for a two dimensional array of quantum dots. The ability to modulate this behavior with an external electric field can allow a controllable Mott transition. Beyond transport, the robust, highly ordered NC arrays described could be useful in photonic devices such as lasers and the water-soluble NC micelle intermediates that are promising for biological labeling. Finally, due to their uniform gold spacings, NC arrays can serve as an optimal platform for sensors and molecular electronic nanocell logic gates formed by 'wiring' the NCs with conjugated dithiol oligomers as was demonstrated in a preliminary experiment.

EXAMPLES

Example 1

Formation of Water-Soluble Gold Nanocrystals, Ordered Gold Nanocrystal Arrays, and Gold Nc/Silica Mesophases 0.4 g surfactant ($CH_3(CH_2)_{15}N^+(CH_2)_3Br^-$) was added to 14 g DI-water (or alternatively, one can use pure water, alcohols, or water and alcohol mixtures) to form solution A. Solution A was sonicated to completely dissolve the surfactant. 0.4 g 1-dodecanethiol (1-DT) derivatized gold nanocrystals were dissolved in 1-2 ml chloroform (can be hexane, benzene, toluene, or other solvents) to form solution B. Solutions A and B were mixed together with vigorous stirring, and the chloroform was removed by vacuum or heat treatment to finish the encapsulation. A dark-red water solution (C) was obtained containing gold nanocrystals. Solution C can be further diluted for UV-vis spectroscopy or TEM characterization. To form ordered nanocrystal arrays, solution C can be deposited on substrates like TEM grids, glass, silicon, mica, and graphite, wherein, after evaporation or drying, ordered nanocrystals arrays will be formed. To synthesize bulk, ordered gold NC/silica mesophases, 1.3 g tetraethyl orthosilicate (TEOS) was added to solution C. The mixture was stirred at room temperature followed by addition of 1N sodium hydroxide (NaOH) aqueous solution (1-3 ml). After 3 hours, the resulting precipitate was recovered by filtration, washing, and drying. To form thin film mesophases, 0.07N hydrogen chloride (HCl) aqueous solution (0.2 ml) was first added to C (2 ml) followed by addition of TEOS (0.2 g) under stirring at room temperature. The solution was stirred for 1-3 hours.

Thin films were deposited on silicon substrates by spin-coating at 500-5000 rpm, casting, or dip-coating.

2. Formation of water-soluble CdSe nanocrystals 0.2 g surfactant ($CH_3(CH_2)_{15}N^+(CH_2)_3Br^-$) was added to 6 g DI-water (again, this can be pure water, alcohols, and water and alcohol mixtures) to form solution A. Solution A was sonicated to completely dissolve the surfactant. 0.2 g trioctylphosphine/hexadecylamine derivatized CdSe nanocrystals were dissolved in 1-2 ml chloroform (alternatively, hexane, benzene, toluene, or other organic solvents) to form solution B. Solutions A and B were mixed together with vigorous stirring, and the chloroform was removed by vacuum or heat treatment to finish the encapsulation. A solution (C) was finally obtained containing CdSe nanocrystals. Solution C can be further diluted for UV-vis spectroscopy or TEM characterization. Mesophase materials were prepared using methods similar to those in the previous example.

The invention being thus described, it will be apparent that the same may be varied in many ways. Such variations are not to be regarded as a departure from the spirit and scope of the invention, and all such modifications as would be obvious to one skilled in the art are intended to be included within the scope of the following claims.

We claim:

1. A method for making a nanocrystalline micellar solution, consisting essentially of:
    forming a first solution comprising a surfactant in water;
    forming a second solution comprising a hydrophobic material, the hydrophobic material comprising a nanocrystal core surrounded by a hydrophobic stabilizing ligand, in an organic solvent;
    mixing the first and second solutions to form a third solution; and
    removing at least a portion of said organic solvent from the third solution to form a solution of nanocrystal micelles, each micelle comprising the nanocrystal core and a hybrid bilayer shell comprising a surfactant secondary layer interdigitated with a hydrophobic stabilizing ligand primary layer.

2. The method of claim 1 further comprising depositing the solution of nanocrystal micelles on a substrate, selected from the group consisting of a transmission electron microscopy grid, silicon, glass, mica, and graphite, and removing at least a portion of said water thereby forming a nanocrystal-micellar ordered array.

3. The method of claim 1 wherein the nanocrystal core is selected from the group consisting of a porphyrin, a dye molecule, carbon nanotubes, a fullerene, an oligomer, a dendrimer, a metal, a semiconductor, a magnetic nanocrystal and a hydrophobic polymer.

4. The method of claim 1 wherein the nanocrystal core is selected from the group consisting of gold, silver, CdSe, CdTe, HgTe, CdHeTe, CdS, PdS, ZnS, ZnSe, CdSe/ZnS, InAs, InP, GaP, GaN, ZnO, Ge, Co, Ni, Fe, Cu, Si, Pt, Pd, PtPd, FePt, and $BaTiO_3$.

5. The method of claim 1 wherein the surfactant is selected from the group consisting of a cationic surfactant, an anionic surfactant, a nonionic surfactant, a block polymer, and a lipid.

6. The method of claim 1 wherein the surfactant is selected from the group consisting of sulfates, sulfonates, phosphates, carboxylic acids, cetyltrimethylammonium bromide, alkylammonium salts, gemini surfactants, cetylethylpiperidinium salts, dialkyldimethylammonium, primary amines, poly(oxyethylene)oxides, octamethylene glycol monodecyl ether, octamethylene glycol monohexadecyl ether and block copolymers.

7. The method of claim 1 wherein the organic solvent is selected from the group consisting of chloroform, hexane, benzene, and toluene.

8. The method of claim 1 wherein the step of removing at least a portion of said organic solvent is performed using a technique selected from the group consisting of heating, evaporation and a vacuum process.

9. The method of claim 1 further comprising the step of adding a precursor co-assembling material to said solution of nanocrystal micelles.

10. The method of claim 9 wherein said precursor co-assembling material is selected from the group consisting of a metal oxide, a water-soluble oligomer and a water-soluble polymer.

11. The method of claim 10 wherein said metal oxide is selected from the group consisting of an alkoxysilane, titanium butoxide, titanium iso-propoxide, zirconium n-butoxide, and aluminum iso-propoxide.

12. The method of claim 11 wherein said alkoxysilane is selected from the group consisting of tetraethylorthosilicate and tetramethylorthosilicate.

13. The method of claim 9 wherein said precursor co-assembling material is selected from the group consisting of a water-soluble aniline oligomer, a water-soluble thiophene oligomer, a water-soluble polyaniline polymer and a water-soluble polythiophene polymer.

14. The method of claim 9 wherein said step of adding a precursor co-assembling material to said solution of nanocrystal micelles is performed in the presence of an acid to form a nanocrystal mesophase material in solution.

15. The method of claim 14 wherein said nanocrystal mesophase material is deposited as a thin film on a substrate to form a three-dimensional mesophase array.

16. The method of claim 15 wherein said substrate is selected from the group consisting of silicon, glass, mica, graphite and a transmission electron microscopy grid.

17. The method of claim 9 wherein said step of adding a precursor co-assembling material to said solution of nanocrystal micelles is performed in the presence of a base to precipitate a three-dimensional, mesophase nanocrystalline array in bulk form.

18. The method of claim 1 wherein the solution of nanocrystal micelles is prepared in less than 10 minutes.

* * * * *